United States Patent
Abu Al-Rubb (10) Patent No.: US 10,230,313 B2
(45) Date of Patent: Mar. 12, 2019

(54) ROLL OF INTERLAYER

(71) Applicant: Khalil Abu Al-Rubb, London (GB)

(72) Inventor: Khalil Abu Al-Rubb, London (GB)

(*) Notice: Subject to any disclaimer, the term of this patent is extended or adjusted under 35 U.S.C. 154(b) by 120 days.

(21) Appl. No.: 15/091,350

(22) Filed: Apr. 5, 2016

(65) Prior Publication Data

US 2016/0218643 A1 Jul. 28, 2016

Related U.S. Application Data

(63) Continuation of application No. 13/737,034, filed on Jan. 9, 2013, now Pat. No. 9,306,476.

(30) Foreign Application Priority Data

Jan. 9, 2012 (GB) .................................. 1200238.2

(51) Int. Cl.
| | |
|---|---|
| *H01L 41/113* | (2006.01) |
| *H02N 2/18* | (2006.01) |
| *E01C 11/00* | (2006.01) |
| *E01C 9/00* | (2006.01) |
| *E01C 7/00* | (2006.01) |

(52) U.S. Cl.
CPC .............. *H02N 2/183* (2013.01); *E01C 9/00* (2013.01); *E01C 11/00* (2013.01); *H01L 41/113* (2013.01); *H02N 2/18* (2013.01); *H02N 2/181* (2013.01); *E01C 7/00* (2013.01); *E01C 2201/00* (2013.01)

(58) Field of Classification Search
CPC ........ H02N 2/18; H02N 2/181; H01L 41/113; H01L 41/1132; H01L 41/1136; H01L 41/1138

USPC .................................................. 310/339
See application file for complete search history.

(56) References Cited

U.S. PATENT DOCUMENTS

| | | |
|---|---|---|
| 2005/0258717 A1 | 11/2005 | Mullen |
| 2008/0083139 A1 | 4/2008 | Mullen |
| 2009/0195124 A1 | 8/2009 | Abramovich et al. |
| 2009/0195226 A1 | 8/2009 | Abramovich et al. |
| 2009/0309456 A1 | 12/2009 | Stollberg |
| 2010/0045111 A1 | 2/2010 | Abramovich et al. |
| 2013/0154441 A1 | 6/2013 | Redmond |

FOREIGN PATENT DOCUMENTS

| | | |
|---|---|---|
| CN | 100336282 | 9/2007 |
| CN | 201010028909.X | 7/2010 |
| EP | 1005003 | 5/2000 |
| JP | 2006197704 | 7/2006 |
| KR | 10-1212997 | 12/2012 |

(Continued)

OTHER PUBLICATIONS

Search Report from United Kingdom patent application GB1200238.2, search report dated May 14, 2015.

(Continued)

*Primary Examiner* — Derek Rosenau
(74) *Attorney, Agent, or Firm* — John Bruckner PC (57) ABSTRACT

A roll of interlayer, suitable for laying between layers of pavement, the roll of interlayer includes at least one layer of interlayer material, a plurality of piezoelectric elements; at least one transmission line coupled to the plurality of piezoelectric elements for transmitting power generated by the plurality of piezoelectric elements to an output. The interlayer is in the form of an elongate, flexible sheet.

17 Claims, 7 Drawing Sheets

(56) References Cited

FOREIGN PATENT DOCUMENTS

WO     WO 2010/116348     10/2010
WO     WO 2011/148369     12/2011

OTHER PUBLICATIONS

Adfors Saint-Gobain, GlasGrid Paving Reinforcement, 2013.
Adfors Saint-Gobain, Glas Pave 50, 2013.
Geosynthetics, Pavement Solutions, TenCate Geosynthetics, 2012.
VSS, Valley Slurry Seal, Co., Jul. 23, 2009.
A high-tech way to defrost, Michael Kanellos, Apr. 14, 2006.
TenCate, Mirafi, Geosynthetics, Pavement Solutions, 2011.
Extended European search report from 13150659.4 dated Dec. 22, 2014.
Examination report from 13150659.4 dated Jun. 1, 2016.
English translation of CN100336282.
English translation of JP2006197704.
MTAG vol. I Flexible Pavement Preservation 2nd Edition, Chaper 12—Interlayers, Caltrans Division of Maintenance, Jan. 27, 2009.
Search Report from United Kingdom patent application GB1200238.2, search report dated Jul. 1, 2012.

ROLL OF INTERLAYER

CROSS-REFERENCE TO RELATED APPLICATIONS

Referring to the application data sheet filed herewith, this application is a continuation of, and claims a benefit of priority under 35 U.S.C. 120 from co-pending utility patent application U.S. Ser. No. 13/737,034, filed Jan. 9, 2013, which in-turn is related to, and claims a benefit of priority under one or more of 35 U.S.C. 119(a)-119(d) from foreign patent application 1200238.2, filed in the United Kingdom on Jan. 9, 2012 under the Paris Convention, the entire contents of both of which are hereby expressly incorporated herein by reference for all purposes.

The present invention relates to a pavement interlayer.

BACKGROUND TO THE INVENTION

The term "energy harvesting" has been widely adopted to describe any process in which very small amounts of power are generated from energy that would be otherwise wasted. Piezoelectric energy harvesting systems use piezoelectric transducers to generate electricity from movement in various load bearing surfaces. For example, systems have been proposed in which piezoelectric transducers are placed under pedestrian walkways, road surfaces and rail tracks. Road surfaces, pedestrian walkways and rail tracks all flex to a degree, in order to provide a surface which is less damaging and more comfortable to the vehicles or pedestrians moving over the surface. When a vehicle moves over a road surface, movement in the road surface can be used to activate a piezoelectric electric transducer and therefore generate electricity. While the amount of power generated by such systems may be low, sufficient power may be generated to power low power loads such as street lamps and ticket barriers.

While several bespoke systems have been proposed for piezoelectric electric energy harvesting, there is a lack of viable off-the-shelf products in this sector. The present invention provides a product which addresses this need.

SUMMARY OF THE INVENTION

In a first aspect, the present invention provides a pavement interlayer, suitable for laying between layers of pavement, comprising: at least one layer of interlayer material, a plurality of piezoelectric elements; at least one transmission line, coupled to the plurality of piezoelectric elements, for transmitting power generated by the plurality of piezoelectric elements to an output.

Further features of the present invention are described in the following description and in the appended claims.

BRIEF DESCRIPTION OF THE DRAWINGS

The present invention will now be described, by way of example only, and in connection with the appended drawings, in which.

DETAILED DESCRIPTION OF EMBODIMENTS OF THE INVENTION

Figure 1:
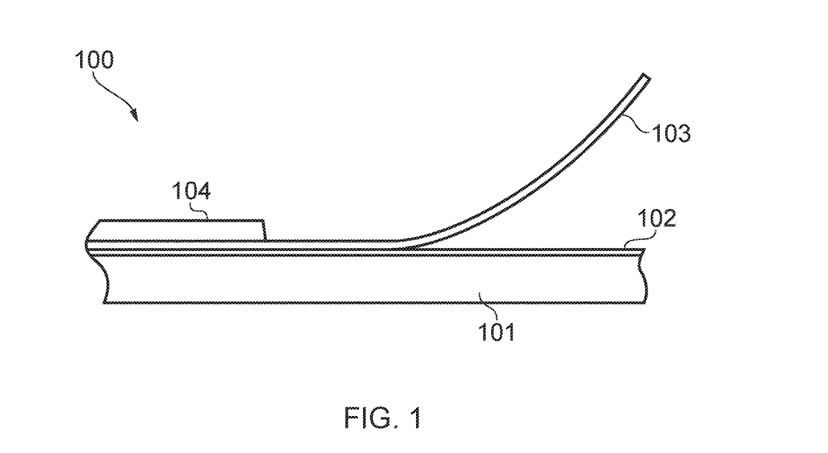
FIG. 1 shows a cross-section through a road surface known from the prior art.

FIG. 1 shows a road surface 100 (otherwise known as a "pavement", depending on geographic location) known from the prior art. Specifically, FIG. 1 shows the process of laying a new asphalt road surface over an old asphalt road surface. The old road surface includes an asphalt overlay 101. The upper surface of the asphalt overlay 101 is the old road surface. When the old asphalt overlay 101 deteriorates, a new road surface is laid over the old surface. It is common for this to be done directly over the old road surface. The new road surface layers are placed directly over the old surface. There are various techniques for laying a new road surface over an old road surface. The example shown in FIG. 1 uses a further asphalt overlay.

Before the new asphalt overlay can be applied to the old surface, a bitumen tack coat 102 is sprayed over the old asphalt overlay 101. The tack coat 102 seals the old asphalt overlay and enables the upper layers of the new road surface to adhere to the old road surface. A preformed pavement interlayer 103 is then rolled out over the tack coat 102. Finally, a new asphalt overlay 104 is applied over the pavement interlayer 103. The pavement interlayer 103 prevents cracks in the old asphalt propagating up into the new asphalt; a process known as reflective cracking. The pavement interlayer 103 prevents moisture penetrating the old surface and also reinforces the road surface.

There are various pavement interlayers available on the market today, each having different properties and being suitable for different road environments. For example, TenCate™ manufacture and sell geosynthetic pavement interlayers. Their products include pavement interlayer fabrics such as Mirafi™ MPV which is non-woven polypropylene waterproof interlayer. They also include pavement interlayer grids such as Mirafi™ FGC which is a fibreglass grid bonded to a non-woven paving fabric. Many other examples are available on the market.

Figure 2A:
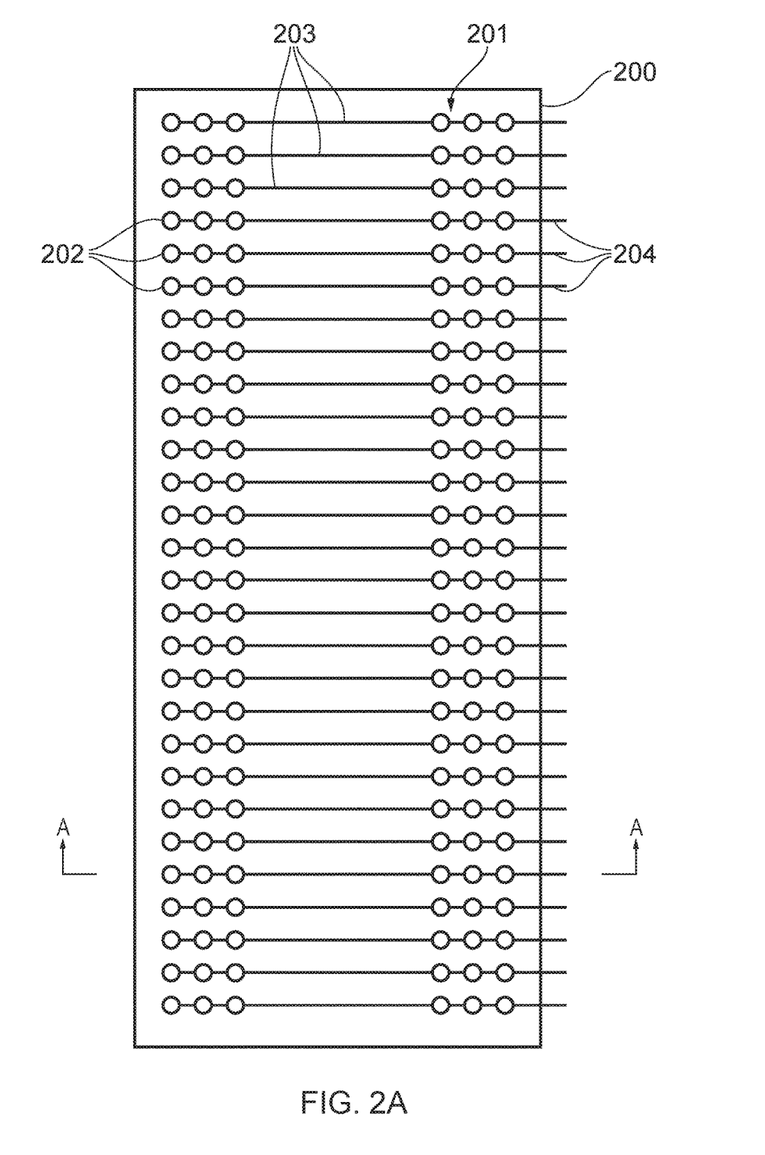
FIG. 2A is a top cut-away view of a pavement interlayer in accordance with an embodiment of the present invention.
Figure 2B:
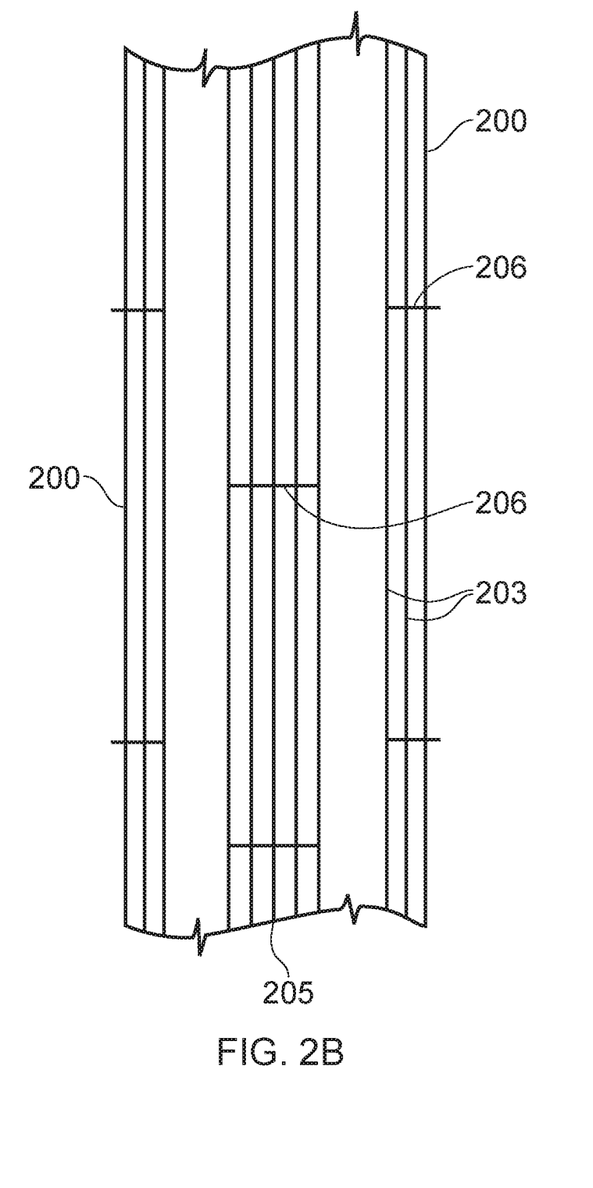
FIG. 2B is a further top cut-away view of a pavement interlayer in accordance with an embodiment of the present invention.
Figure 3:
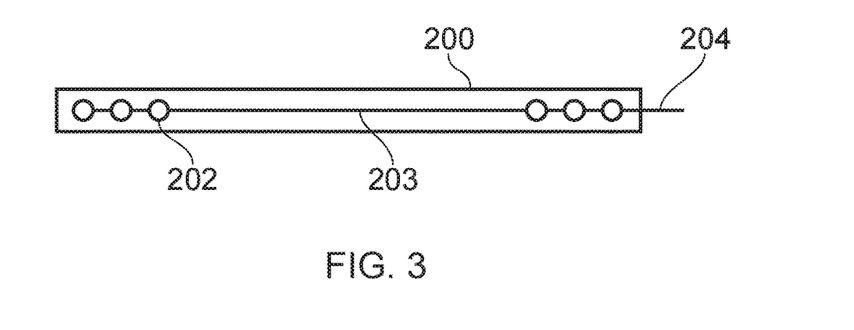
FIG. 3 is a cross-sectional view of the pavement interlayer of FIG. 2A.

FIGS. 2A, 2B and 3 show a pavement interlayer 200 in accordance with an embodiment of the present invention. FIG. 2A shows a top cut-away view of the pavement interlayer 200. FIG. 3 is a cross-sectional view of the pavement interlayer 200 across section A-A. The pavement interlayer has a piezoelectric generator grid 201 embedded therein. The piezoelectric generator grid includes a plurality of piezoelectric generators 202 which are distributed along the interlayer in areas corresponding to vehicle tracks. The generators 202 are coupled together using a system of transmission lines 203. The transmission lines 203 terminate at connection points 204 along an edge of the pavement interlayer. When placed under a new road surface, movement in the road surface, caused by traffic activity, causes the piezoelectric generators to generate electricity. The connection points 204 are coupled to an external power management unit (not shown), which feeds the power generated into an external power system. Accordingly, some of the energy that would otherwise be wasted as heat in the road surface is converted into electrical energy by the system.

Referring to FIG. 2A, the pavement interlayer 200 may be a geosynthetic interlayer, such as those manufactured by TenCate™. Specifically, the pavement interlayer 200 may be a pavement fabric such as Mriafi™ MPV. The pavement interlayer 200 is the width of a single road lane (between 2.5 m and 4 m) and is considerably longer in length. The pavement interlayer may be stored as a roll on a spool, and be anything from 10 m to 100 m in length. In FIG. 2A, the pavement interlayer 200 is shown schematically, and the dimensions are not intended to be in proportion. In use, the pavement interlayer 200 is rolled out over a road surface using a specialist machine, as will be familiar to this skilled in the art.

The piezoelectric generator grid 201 is embedded within the pavement interlayer 200 during manufacture of the interlayer. In this embodiment, the piezoelectric generators 202 and are distributed along the pavement interlayer 200 in areas corresponding to vehicle tracks. Each generator 202 is positioned in a row formed across the pavement interlayer 200 and in a column formed along the length of the interlayer. In this embodiment, the each row includes three generators 202 across each track. The generators are spaced 10 cm apart, in the direction of the rows and columns. This is an example of the spacing which may be possible. It is possible to space the generators closer or further apart than this. The piezoelectric generators 202 are positioned in this manner so as to be in the areas most frequently passed over by vehicles. Other arrangements are possible, as will be appreciated by the person skilled in the art. For example, the generators 202 may be distributed throughout the interlayer, so as to recover energy from vehicles changing lanes, or motorbikes which may travel toward the centre of the lane, Each piezoelectric generator 202 is coupled to another generator in the same row by power transmission lines 203. Alternatively, the generators may be connected along the length of the pavement interlayer. Each transmission line 203 is coupled to a connector 204 which protrudes from the edge of the pavement interlayer 200. Accordingly, the pavement interlayer 200 includes a plurality of connectors along one edge of the interlayer. Connectors 204 are for coupling the transmission lines 203 to an external transmission line (not shown). Each piezoelectric generator 202 has two outputs across which a voltage is generated when pressure is applied to the generator. The power transmission lines 203 each include two cables. One cable is coupled each output. The piezoelectric generators 202 may be connected in parallel, each cable being coupled to corresponding outputs of each generator.

FIG. 2B is an embodiment of the present invention in which the transmission lines 203 run along the length of the pavement interlayer 200. In FIG. 2B, two interlayers 200 are shown side-by-side. The interlayers touch at join 205. The transmission lines 203 connect the generators (not shown) along the length of the interlayer. At certain intervals, connecting lines 206 are formed across the transmission lines in order for the adjacent interlayers to be coupled together, and for the transmission lines to be coupled to the external power system.

Figure 4:
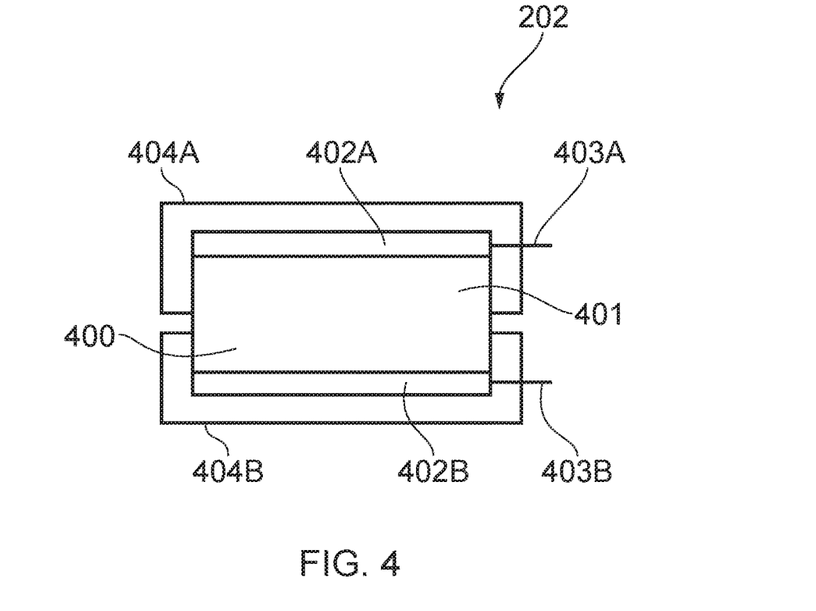
FIG. 4 is a schematic diagram of a piezoelectric generator for use with an embodiment of the present invention.

FIG. 4 shows a piezoelectric generator 202 in accordance with an embodiment of the present invention. The generator 202 includes a piezoelectric transducer 400. The transducer 400 includes a disc-shaped piece of piezoelectric material 401. The transducer 400 also includes two electrodes 402A, 402B which are attached to the piezoelectric material. When pressure is applied to the piezoelectric material 401, a potential difference is generated across the electrodes 402A, 402B as will be familiar to those skilled in the art. Each electrode 402A, 402B includes an output connector 403A, 403B, for coupling to the power transmission lines 203. The piezoelectric generator 202 also includes protective members 404A, 404B. Each member 404A, 404B is disc-shaped and covers the top or bottom of the transducer 400. In cross-section, the members are U-shaped. There is a small gap between each member in order to allow pressure against the protective members to be transmitted to the transducer 400. The protective members 404A, 404B may be made of plastic or another other suitable protective material. The protective members 404A, 404B serve to protect the piezoelectric transducer as well as to act as a conduit for pressure applied to the piezoelectric generator 202.

Figure 5:
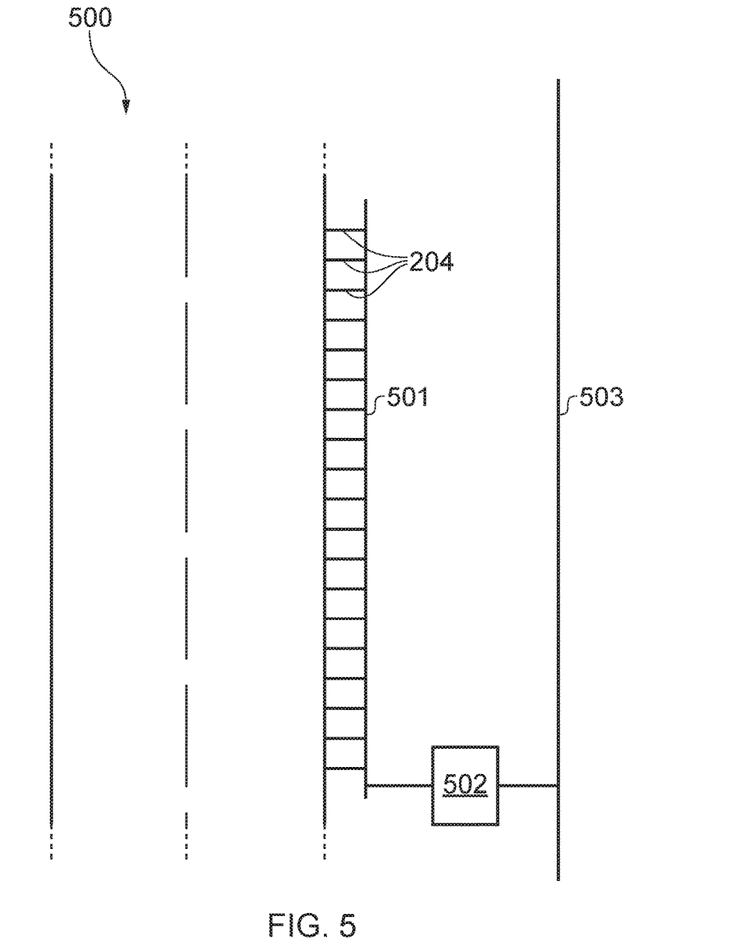
FIG. 5 is a schematic diagram of an installation which includes a pavement interlayer as shown in FIG. 2A.

FIG. 5 shows a road surface 500 which has been laid using the pavement interlayer 200. Each of the connectors 204 protrude from the side of the road surface and are coupled to a local transmission line 501. The local power transmission line 501 is coupled to a power management unit 502. The power management unit 502 includes rectification, storage and regulation circuitry. The power management unit 502 is coupled to an external transmission line 503 enabling regulated power to be transmitted to an external power system.

Figure 6:
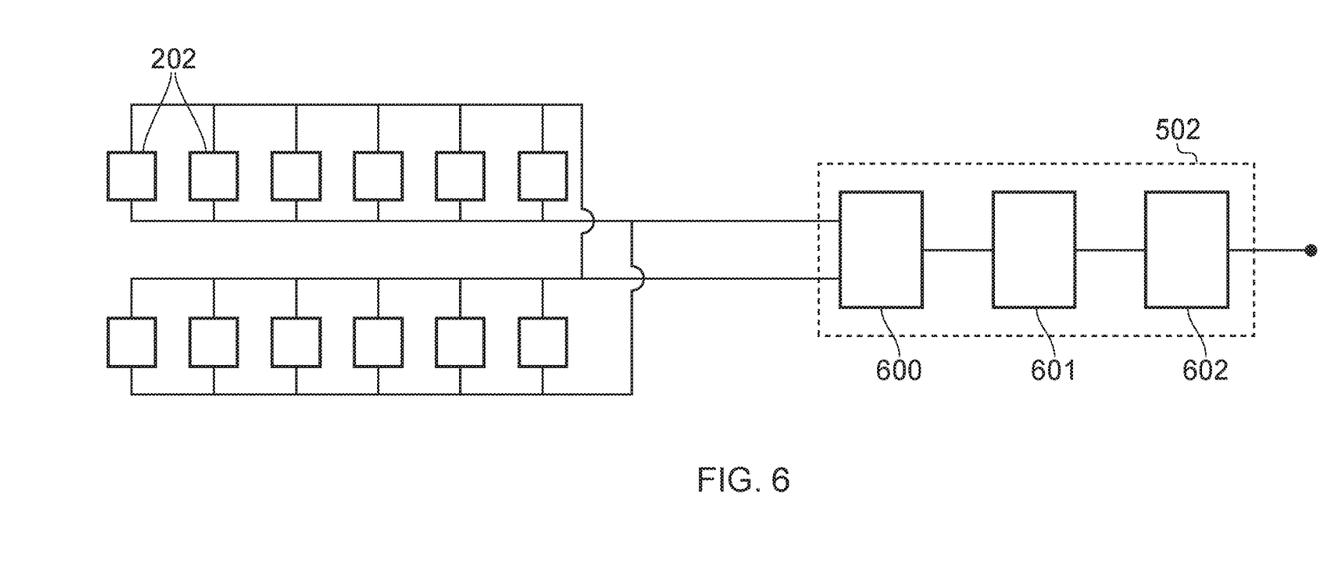
FIG. 6 is a schematic diagram of a circuit including the components of the installation shown in FIG. 5.

FIG. 6 is a schematic diagram of the circuit formed by the combination of the piezoelectric generators 202, and the power management unit 502. The power management unit 502 comprises a rectifier 600, a storage unit 601 and a regulator 602.

The parallel combination of piezoelectric generators 202 generate a variable voltage which is rectified by the rectifier 600. The storage unit 601 stores the rectified input which is then regulated by regulator 602 and fed into an external power system. In this embodiment, the rectifier is provided as part of the power management unit 502. As an alternative, rectifiers may be provided within each piezoelectric generator or at the road-side, at the end of each row of piezoelectric generators.

Figure 7:
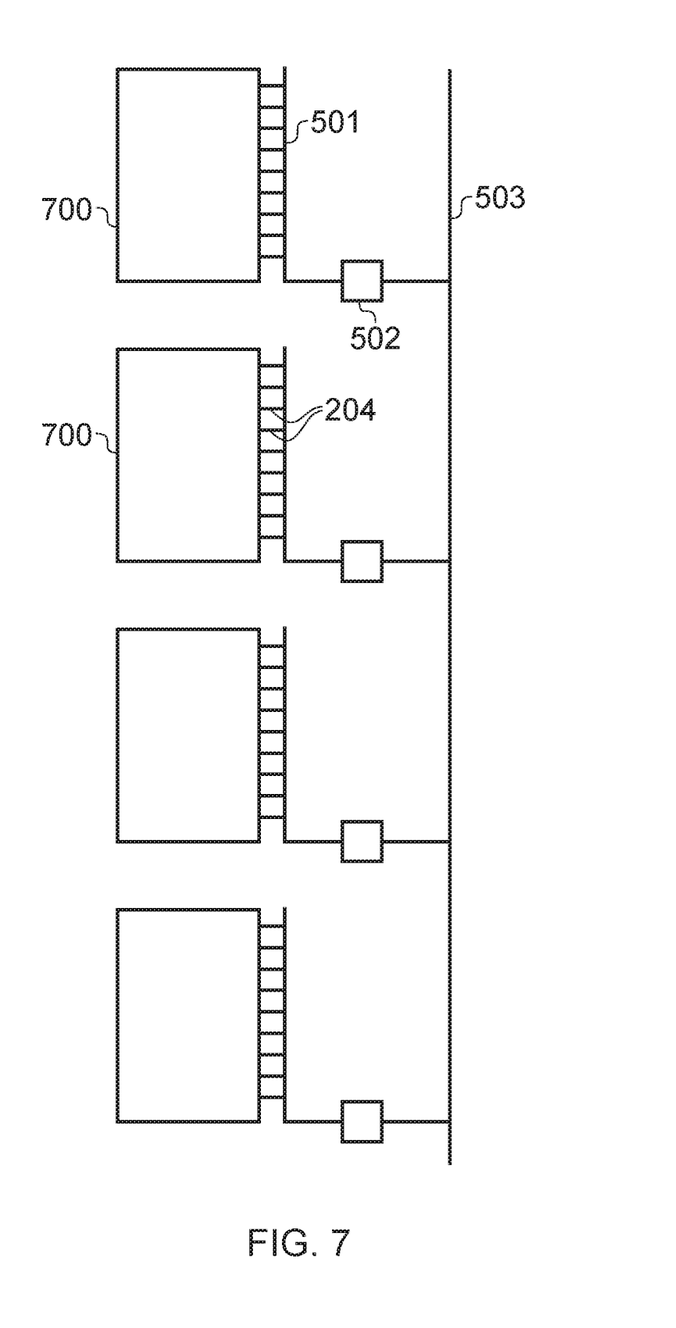
FIG. 7 is a further schematic diagram of an installation which includes a pavement interlayer as shown in FIG. 2A.

FIG. 7 is a schematic diagram of a section of road which includes several piezoelectric grid sections 700. Each grid section includes a predetermined number of rows of piezoelectric generators 202. For example, each section may be a maximum of 10 meters long. Each grid section 700 includes a portion of local transmission line 501. Each section is coupled to a power management unit 502, which is in turn coupled to an external transmission line 503.

In the above-described embodiments, the top layer of the pavement is asphalt. Other road surfaces may be used in conjunction with embodiments of the present invention. For example, the embodiments of the present invention may be used with slurry seal or micro surfacing, amongst others.

Electricity generated by the above-described interlayer may be used for a variety of purposes, including street lighting, barrier operation and in road de-icing systems, amongst many others. The electricity may also be fed back into the mains power grid.

While the present invention has been described above in connection with overlaying an existing road surface, it may be used in a variety of other situations. For example, where are road surface has been subjected to cold milling such as road scarifying, an interlayer according to an embodiment of the invention may be laid over such as surface. An interlayer may also be laid between base and wearing layers of a new road surface.

The term "pavement" covers any surface which may be used by transport vehicles such as cars, trucks, buses, airplanes etc. In particular, it covers surfaces which are finished with an asphalt layer. It is not limited to pedestrian walkways, which are in some countries, such as the UK, referred to as pavements.

The term "piezoelectric element" is intended to cover any component or group of components which is suitable generating electricity in response to pressure, vibration or other movement. It is not intended to be limited to any particular type or construction of piezoelectric device.

The invention claimed is:

1. An article of manufacture, comprising a roll of interlayer, suitable for laying between layers of pavement, the roll of interlayer including: at least one layer of interlayer material; a plurality of piezoelectric elements; at least one transmission line coupled to the plurality of piezoelectric elements for transmitting power generated by the plurality of piezoelectric elements to an output, wherein the interlayer is in the form of an elongate, flexible sheet.

2. The article of manufacture according to claim 1, wherein the plurality of piezoelectric elements are embedded within the at least one layer of interlayer material, or on or against the at least one layer of interlayer material.

3. The article of manufacture according to claim 1, wherein the plurality of piezoelectric elements are distributed in a predetermined manner through the at least one layer of interlayer material.

4. The article of manufacture according to claim 3, wherein the plurality of piezoelectric elements are distributed in a grid pattern.

5. The article of manufacture according to claim 3, wherein the roll of interlayer is for use on a road, and the plurality of piezoelectric elements are distributed along two tracks.

6. The article of manufacture according to claim 1, further comprising electrical connectors distributed along one edge of the roll of interlayer.

7. The article of manufacture according to claim 1, the at least one layer of interlayer material comprising a first and a second layer of interlayer material, wherein the plurality of piezoelectric elements are positioned between the first and second layers of interlayer material.

8. The article of manufacture according to claim 1, further comprising at least one rectifier coupled to the at least one transmission line.

9. The article of manufacture according to claim 1, wherein the piezoelectric elements comprise protective members, located about an upper surface and a lower surface of the piezoelectric elements.

10. The article of manufacture according to claim 9, wherein the protective members are U-shaped.

11. The article of manufacture according to claim 10, wherein the protective members are arranged to permit the compression of the piezoelectric element, and arranged to limit the compression of the piezoelectric element beyond a predefined limit.

12. The article of manufacture according to claim 11, wherein the protective members are fabricated from a material which has a lower compressibility than the piezoelectric element.

13. The article of manufacture according to claim 1, wherein the interlayer material includes a pavement fabric.

14. An article of manufacture, comprising a roll of interlayer, suitable for laying between layers of pavement, the roll of interlayer including: at least one layer of geosynthetic interlayer material; a plurality of piezoelectric elements; and at least one transmission line coupled to the plurality of piezoelectric elements; for transmitting power generated by the plurality of piezoelectric elements to an output.

15. The article of manufacture according to claim 14, further comprising a spool, wherein the roll of interlayer is located on the spool.

16. The article of manufacture according to claim 15, wherein the plurality of piezoelectric elements are embedded within the at least one layer of geosynthetic interlayer material.

17. The article of manufacture according to claim 16, wherein the plurality of piezoelectric elements are distributed throughout the at least one layer of geosynthetic interlayer material in areas corresponding to vehicle tracks.

* * * * *